United States Patent
Liu et al.

(10) Patent No.: US 12,163,983 B2
(45) Date of Patent: *Dec. 10, 2024

(54) PACKAGED CURRENT SENSOR INTEGRATED CIRCUIT

(71) Applicant: Allegro MicroSystems, LLC, Manchester, NH (US)

(72) Inventors: Shixi Louis Liu, Hooksett, NH (US); Robert A. Briano, Auburn, NH (US); Natasha Healey, Manchester, NH (US)

(73) Assignee: Allegro MicroSystems, LLC, Manchester, NH (US)

(*) Notice: Subject to any disclaimer, the term of this patent is extended or adjusted under 35 U.S.C. 154(b) by 162 days.

This patent is subject to a terminal disclaimer.

(21) Appl. No.: 18/053,480

(22) Filed: Nov. 8, 2022

(65) Prior Publication Data

US 2023/0060219 A1   Mar. 2, 2023

Related U.S. Application Data

(63) Continuation-in-part of application No. 17/654,254, filed on Mar. 10, 2022, now Pat. No. 11,768,229, (Continued)

(51) Int. Cl.
*G01R 15/20* (2006.01)
*G01R 19/00* (2006.01)
(Continued)

(52) U.S. Cl.
CPC ......... *G01R 15/20* (2013.01); *G01R 19/0092* (2013.01); *H01L 22/14* (2013.01); *H01L 23/49575* (2013.01)

(58) Field of Classification Search
CPC .............. H01L 23/49575; H01L 22/14; G01R 19/1659; G01R 33/072
See application file for complete search history.

(56) References Cited

U.S. PATENT DOCUMENTS 5,255,157 A   10/1993  Hegel
5,557,504 A    9/1996  Siegel et al.
(Continued)

FOREIGN PATENT DOCUMENTS

| EP | 3671228 | 6/2020 |
|----|---------|--------|
| EP | 4141451 | 3/2023 |
| FR | 3090121 | 6/2020 |

OTHER PUBLICATIONS

U.S. Appl. No. 18/182,434, filed Mar. 13, 2023, Liu.
(Continued)

*Primary Examiner* — David A Zarneke
(74) *Attorney, Agent, or Firm* — Daly, Crowley, Mofford & Durkee, LLP

(57) ABSTRACT

A packaged current sensor integrated circuit includes a primary conductor having an input portion and an output portion configured to carry a current to be measured by one or more magnetic sensing elements supported by a semiconductor die adjacent to the primary conductor. A method of fabricating the packaged current sensor integrated circuit includes partially encasing the lead frame in a first mold material, applying an insulator to one or more die attach pads, attaching a die to the insulator, electrically connecting the die to secondary leads, and providing a second mold to the subassembly. The package is configured to provide increased voltage isolation.

24 Claims, 9 Drawing Sheets

Related U.S. Application Data which is a continuation-in-part of application No. 17/409,011, filed on Aug. 23, 2021, now Pat. No. 11,519,946.

(51) Int. Cl.
*H01L 21/66* (2006.01)
*H01L 23/495* (2006.01)

(56) References Cited

U.S. PATENT DOCUMENTS

| | | | |
|---|---|---|---|
| 5,570,273 | A | 10/1996 | Siegel et al. |
| 6,211,462 | B1 | 4/2001 | Carter, Jr. et al. |
| 6,326,243 | B1 | 12/2001 | Suzuya et al. |
| 6,356,068 | B1 | 3/2002 | Steiner et al. |
| 6,781,359 | B2 | 8/2004 | Stauth et al. |
| 6,995,315 | B2 | 2/2006 | Sharma et al. |
| 7,005,754 | B2 | 2/2006 | Howarth |
| 7,075,287 | B1 | 7/2006 | Mangtani et al. |
| 7,166,807 | B2 | 1/2007 | Gagnon et al. |
| 7,265,531 | B2 | 9/2007 | Stauth et al. |
| 7,372,147 | B2 | 5/2008 | Dai et al. |
| 7,476,816 | B2 | 1/2009 | Doogue et al. |
| 7,554,180 | B2 | 6/2009 | McKerreghan et al. |
| 7,598,601 | B2 | 10/2009 | Taylor et al. |
| 7,709,754 | B2 | 5/2010 | Doogue et al. |
| 7,816,905 | B2 | 10/2010 | Doogue et al. |
| 8,080,994 | B2 | 12/2011 | Taylor et al. |
| 8,604,777 | B2 | 12/2013 | Doogue et al. |
| 8,629,539 | B2 | 1/2014 | Milano et al. |
| 8,907,437 | B2 | 12/2014 | Milano et al. |
| 9,190,606 | B2 | 11/2015 | Liu et al. |
| 9,299,915 | B2 | 3/2016 | Milano et al. |
| 9,383,425 | B2 | 7/2016 | Milano et al. |
| 9,494,660 | B2 | 11/2016 | David et al. |
| 9,620,705 | B2 | 4/2017 | Milano et al. |
| 9,666,788 | B2 | 5/2017 | Taylor et al. |
| 9,788,403 | B2 | 10/2017 | Mrusek |
| 9,812,588 | B2 | 11/2017 | Vig et al. |
| 9,865,807 | B2 | 1/2018 | Liu et al. |
| 10,230,006 | B2 | 3/2019 | Vig et al. |
| 10,234,513 | B2 | 3/2019 | Vig et al. |
| 10,333,055 | B2 | 6/2019 | Milano et al. |
| 10,345,343 | B2 | 7/2019 | Milano et al. |
| 10,509,058 | B2 | 12/2019 | Cadugan et al. |
| 10,578,684 | B2 | 3/2020 | Cadugan et al. |
| 10,718,794 | B2 | 7/2020 | El Bacha et al. |
| 10,753,963 | B2 | 8/2020 | Milano et al. |
| 10,916,665 | B2 | 2/2021 | Vig et al. |
| 11,024,576 | B1 | 6/2021 | West et al. |
| 11,085,952 | B2 | 8/2021 | Cadugan et al. |
| 11,519,946 | B1 * | 12/2022 | Rock ................. G01R 19/1659 |
| 11,768,229 | B2 * | 9/2023 | Boden ................. G01R 19/252 |
| | | | 324/117 H |
| 2002/0190703 | A1 | 12/2002 | Goto et al. |
| 2003/0193018 | A1 | 10/2003 | Tao et al. |
| 2004/0124505 | A1 | 7/2004 | Mahle et al. |
| 2005/0030018 | A1 | 2/2005 | Shibahara et al. |
| 2005/0124185 | A1 | 6/2005 | Cromwell et al. |
| 2007/0126092 | A1 | 6/2007 | San Antonio et al. |
| 2007/0279053 | A1 | 12/2007 | Taylor et al. |
| 2008/0297138 | A1 | 12/2008 | Taylor et al. |
| 2010/0156394 | A1 | 6/2010 | Ausserlechner et al. |
| 2011/0049685 | A1 | 3/2011 | Park et al. |
| 2011/0234215 | A1 | 9/2011 | Ausserlechner |
| 2011/0248711 | A1 | 10/2011 | Ausserlechner |
| 2012/0089266 | A1 | 4/2012 | Tomimbang et al. |
| 2013/0015843 | A1 | 1/2013 | Doogue et al. |
| 2013/0020660 | A1 | 1/2013 | Milano et al. |
| 2013/0138372 | A1 | 5/2013 | Ausserlechner |
| 2014/0253103 | A1 | 9/2014 | Racz et al. |
| 2014/0264678 | A1 | 9/2014 | Liu et al. |
| 2014/0266181 | A1 | 9/2014 | Milano et al. |
| 2015/0108967 | A1 | 4/2015 | Barczyk |
| 2015/0270198 | A1 | 9/2015 | Cuoco et al. |
| 2016/0187388 | A1 | 6/2016 | Suzuki et al. |
| 2016/0216296 | A1 | 7/2016 | Nakayama et al. |
| 2016/0223594 | A1 | 8/2016 | Suzuki et al. |
| 2016/0282388 | A1 | 9/2016 | Milano et al. |
| 2016/0282425 | A1 | 9/2016 | Haas et al. |
| 2016/0313375 | A1 | 10/2016 | Etschmaier |
| 2017/0179067 | A1 | 6/2017 | Aoki et al. |
| 2017/0336481 | A1 | 11/2017 | Latham et al. |
| 2018/0149677 | A1 | 5/2018 | Milano et al. |
| 2018/0166350 | A1 | 6/2018 | Racz et al. |
| 2018/0306843 | A1 | 10/2018 | Bussing et al. |
| 2019/0049527 | A1 | 2/2019 | Vig et al. |
| 2019/0109072 | A1 | 4/2019 | David et al. |
| 2019/0154737 | A1 | 5/2019 | Nobira |
| 2019/0204363 | A1 | 7/2019 | Suzuki et al. |
| 2019/0369144 | A1 | 12/2019 | Mauder et al. |
| 2020/0033384 | A1 | 1/2020 | Kishi et al. |
| 2020/0064382 | A1 | 2/2020 | Takata et al. |
| 2020/0191835 | A1 | 6/2020 | Bilbao de Mendizabal et al. |
| 2021/0082789 | A1 | 3/2021 | Briano et al. |
| 2021/0111284 | A1 | 4/2021 | Vig et al. |
| 2021/0243911 | A1 | 8/2021 | Tang et al. |
| 2021/0263077 | A1 | 8/2021 | Hirano et al. |
| 2021/0397015 | A1 | 12/2021 | Moon |
| 2022/0018880 | A1 | 1/2022 | Houis |

OTHER PUBLICATIONS

Office Action dated Mar. 15, 2023 for U.S. Appl. No. 17/654,254, 19 pages.
Response to Office Action dated Mar. 15, 2023 filed on Mar. 22, 2023 for U.S. Appl. No. 17/654,254, 10 pages.
Steve Bush, DNP claims world's thinnest chip package, https://www.electronicsweekly.com/news/products/micros/ dnp-claims-worlds-thinnest-chip-package-2009-03/ (Year: 2009).
U.S. Appl. No. 17/657,135, filed Mar. 30, 2022, Liu, et al.
U.S. Appl. No. 17/817,796, filed Aug. 5, 2022, Briano, et al.
Notice of Allowance dated Aug. 9, 2023 for U.S. Appl. No. 17/654,254; 5 pages.
U.S. Appl. No. 17/654,254, filed Mar. 10, 2022, Boden, et al.
U.S. Notice of Allowance dated Aug. 23, 2022 for U.S. Appl. No. 17/409,011; 10 pages.
European Extended Search Reporting dated Dec. 22, 2022 for European Application No. 22183450.0; 7 pages.
U.S. Appl. No. 18/490,815, filed Oct. 20, 2023, Briano, et al.
Response to European Examination Report dated Aug. 28, 2023 for European Application No. 22183450.0 as filed on Oct. 30, 2023; 18 pages.
Office Action dated May 19, 2023 for U.S. Appl. No. 17/654,254; 15 pages.
Response to Office Action dated May 19, 2023 filed on May 25, 2023 for U.S. Appl. No. 17/654,254; 9 pages.
Search Report and Written Opinion dated Apr. 25, 2023 for PCT Application No. PCT/US2022/051968; 16 pages.
European Examination Report dated Aug. 28, 2023 for European Application No. 22183450.0, 4 pages.
European Response filed on Jun. 14, 2023 for European Application No. 22183450.0; 24 pages.

* cited by examiner

PACKAGED CURRENT SENSOR INTEGRATED CIRCUIT

CROSS REFERENCE TO RELATED APPLICATIONS

This application is a continuation-in-part of and claims priority to and the benefit of U.S. patent application Ser. No. 17/654,254, entitled "Packaged Current Sensor Integrated Circuit" and filed on Mar. 10, 2022, which is a continuation-in-part of and claims priority to and the benefit of U.S. patent application Ser. No. 17/409,011, entitled "Packaged Current Sensor Integrated Circuit" and filed Aug. 23, 2021, the entirety of which are hereby incorporated herein by reference in their entireties.

BACKGROUND

Some conventional current sensors are positioned near a current-carrying conductor to sense a magnetic field generated by a current through the conductor. The current sensor generates an output signal having a magnitude proportional to the magnetic field induced by the current through the conductor.

SUMMARY

According to the disclosure, a method of manufacturing a current sensor integrated circuit package includes providing a lead frame comprising a primary conductor and at least two secondary leads, wherein the primary conductor comprises an input portion and an output portion, a first die attach portion, a second die attach portion, and a current conductor portion, wherein the primary conductor is configured to carry a current from the input portion through the first die attach portion, the current conductor portion, the second die attach portion, and the output portion. The method further includes providing a first mold of an insulating material to partially enclose part of the output portion, the first and second die attach portions, and the at least two secondary leads, providing an insulator portion on the first die attach portion, second die attach portion, current conductor portion, and the first mold, providing a semiconductor die on the insulator portion, providing wire bonds to connect the semiconductor die to the at least two secondary leads, providing at least one magnetic field sensing element supported by the semiconductor die and positioned near the current conductor portion, and providing a second mold of an insulating material to enclose the semiconductor die, wire bonds, and insulator portion, wherein the second mold forms a package body.

Features may include one or more of the following individually or in combination with other features. The input portion and the output portion of the primary conductor do not extend beyond the second mold. The at least one magnetic field sensing element is a first magnetic field sensing element disposed adjacent to a first side of the current conductor portion and the method further includes providing a second magnetic field sensing element disposed adjacent to a second side of the current conductor portion opposite to the first side. The at least one magnetic field sensing element is one of a planar Hall effect element, a vertical Hall effect element, a anisotropic magnetoresistance (AMR) element, a giant magnetoresistance (GMR) element, a tunneling magnetoresistance (TMR) element, or coil. The input portion of the primary conductor is exposed from a first side of the package body and a second side of the package body that is substantially orthogonal with respect to the first side of the package body, and wherein the output portion of the primary conductor is exposed from the second side of the package body and a third side of the package body that is substantially orthogonal with respect to the second side of the package body and opposite with respect to the first side of the package body. A distance between an exposed portion of the primary conductor and an exposed portion of the secondary leads is at least 1.0 mm. A distance between an exposed portion of the primary conductor and an exposed portion of the secondary leads is at least 7.2 mm. Providing the first and second molds are performed in a single cavity for the lead frame. The method can further include singulating the molded lead frame into individual current sensor packages.

Also described is a current sensor integrated circuit package including a primary conductor having an input portion and an output portion, wherein the primary conductor is configured to carry a current from the input portion of the primary conductor to the output portion of the primary conductor, wherein the primary conductor further comprises an exposed portion, at least two secondary leads, each having an exposed portion spaced from the exposed portion of the primary conductor by an isolation distance of at least 2.0 mm, a semiconductor die disposed adjacent to the primary conductor and positioned on an insulator portion, and at least one magnetic field sensing element supported by the semiconductor die. A package body encloses the semiconductor die and at least a portion of the primary conductor, wherein the input portion of the primary conductor is exposed from a first side of the package body and a second side of the package body that is substantially orthogonal with respect to the first side of the package body, and wherein the output portion of the primary conductor is exposed from the second side of the package body and a third side of the package body that is substantially orthogonal with respect to the second side of the package body and opposite with respect to the first side of the package body.

Features may include one or more of the following individually or in combination with other features. The primary conductor and the at least two secondary leads are partially encased by a first mold portion. An isolation distance between an exposed portion of the at least two secondary leads and an exposed portion of the primary conductor can be at least 4.0 mm. An isolation distance between an exposed portion of the at least two secondary leads and an exposed portion of the primary conductor can be at least 7.2 mm. At least one secondary lead provides an output connection, at least one secondary lead provides a voltage input connection, and at least one secondary lead provides a ground connection. The current sensor integrated circuit package can further include a front-end amplifier, wherein the at least one magnetic field sensing element is coupled to the front-end amplifier. The current sensor integrated circuit package can further include at least two magnetic field sensing elements. The at least two magnetic field sensing elements can be Hall effect elements. The at least two magnetic field sensing elements can be coupled to provide a differential output. At least one of the secondary leads can provide a fault signal. The current sensor integrated circuit package can further include a wafer backside coating material on a back side of the semiconductor die. The current sensor integrated circuit package can further include a second wafer backside coating material on the back of the semiconductor die. The exposed portion of the primary conductor can be substantially orthogonal to the first side of the package body, the second side of the package body, and the third side of the package body. The insulator portion can extend beyond an edge of the primary conductor towards the at least two secondary leads. The insulator portion can extend beyond the edge of the primary conductor towards the at least two secondary leads by at least 0.1 mm. The insulator portion can extend beyond the edge of the primary conductor towards the secondary leads by at least 0.4 mm.

BRIEF DESCRIPTION OF DRAWINGS

The foregoing features of this disclosure, as well as the disclosure itself, may be more fully understood from the following description of the drawings in which.

DETAILED DESCRIPTION

Figure 1A:
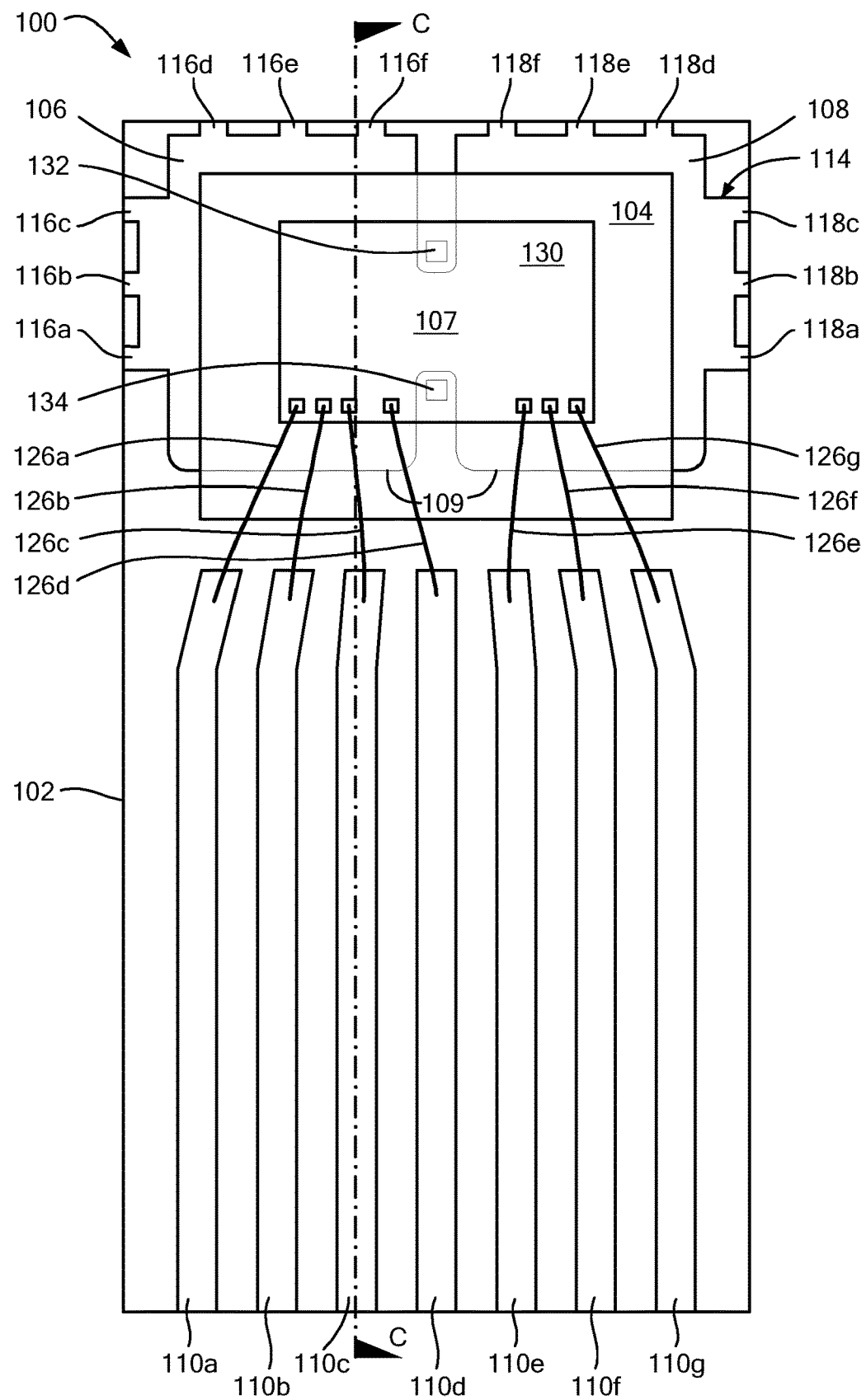
FIG. 1A provides a top view of a packaged current sensor integrated circuit according to the disclosure.

As used herein, the term "magnetic field sensing element" is used to describe a variety of electronic elements that can sense a magnetic field. The magnetic field sensing element can be, but is not limited to, a Hall effect element, a magnetoresistance element, or a magnetotransistor. As is known, there are different types of Hall effect elements, for example, a planar Hall effect element, a vertical Hall effect element, and a Circular Vertical Hall (CVH) element. As is also known, there are different types of 'magnetoresistance elements, for example, a semiconductor magnetoresistance element such as Indium Antimonide (InSb), a giant magnetoresistance (GMR) element, for example, a spin valve, an anisotropic magnetoresistance element (AMR), a tunneling magnetoresistance (TMR) element, and a magnetic tunnel junction (MTJ). The magnetic field sensing element may be a single element or, alternatively, may include two or more magnetic field sensing elements arranged in various configurations, e.g., a half-bridge or full (Wheatstone) bridge, configured for single-ended or differential sensing. Depending on the device type and other application requirements, the magnetic field sensing element may be a device made of a type IV semiconductor material such as Silicon (Si) or Germanium (Ge), or a type III-V semiconductor material like Gallium-Arsenide (GaAs) or an Indium compound, e.g., Indium-Antimonide (InSb). A coil may also be used to sense magnetic fields, which may be referred to as inductive sensing. Using a coil to sense a magnetic field is more typical as the frequency of the magnetic field to be sensed increases.

As is known, some of the above-described magnetic field sensing elements tend to have an axis of maximum sensitivity parallel to a substrate that supports the magnetic field sensing element, and others of the above-described magnetic field sensing elements tend to have an axis of maximum sensitivity perpendicular to a substrate that supports the magnetic field sensing element. In particular, planar Hall effect elements tend to have axes of sensitivity perpendicular to a substrate, while metal based or metallic magnetoresistance elements (e.g., GMR, TMR, AMR) and vertical Hall effect elements tend to have axes of sensitivity parallel to a substrate.

As used herein, the term "magnetic field sensor" is used to describe a circuit that uses a magnetic field sensing element, generally in combination with other circuits. Magnetic field sensors are used in a variety of applications, including, but not limited to, an angle sensor that senses an angle of a direction of a magnetic field, a current sensor that senses a magnetic field generated by a current carried by a current-carrying conductor, a magnetic switch that senses the proximity of a ferromagnetic object, a rotation detector that senses passing ferromagnetic articles, for example, magnetic domains of a ring magnet or a ferromagnetic target (e.g., gear teeth) where the magnetic field sensor is used in combination with a back-biased or other magnet, and a magnetic field sensor that senses a magnetic field density of a magnetic field.

FIG. 1A shows a top view of a packaged current sensor integrated circuit 100. A lower package body 102 may be a mold compound comprising an insulating material and can be referred to herein alternatively as the first mold compound 102. The first mold compound 102 partially encloses part of the lead frame. The lead frame includes a primary conductor portion 114 and secondary leads 110a-110g.

The primary current conductor portion 114, or primary current path, has input and output portions that can include die attach portions 106, 108, respectively, and a current path portion 107. The primary conductor portion 114 supports an insulator, or insulator portion 104, and a semiconductor die 130. Die attach portions 106, 108 can alternatively be referred to as die attach pads or paddles. Die 130 supports at least one magnetic field sensing element, and, in an example embodiment, supports two magnetic field sensing elements 132, 134. The die 130 can also support circuitry to amplify and process signals from the magnetic field sensing elements 132, 134 and provide an output of the current sensor integrated circuit 100. As current flows through the primary conductor, a magnetic field is generated and may be sensed by magnetic field sensing elements 132, 134.

The primary conductor portion 114 includes inputs 116a, 116b, 116c on a first side of the packaged integrated circuit 100 and inputs 116d, 116e, 116f on a second side of the package. The primary conductor portion 114 further includes outputs 118a, 118b, 118c on a third side of the package and outputs 118d, 118e, 118f on the second side of the package. Inputs 116a-f are connected to die attach portion 106 and outputs 118a-f are connected to die attach portion 108. In embodiments, the input portion of the primary conductor 114 is exposed from the first side of the package body and the second side of the package body that is substantially orthogonal with respect to the first side of the package body, and the output portion of the primary conductor is exposed from the second side of the package body and the third side of the package body that is substantially orthogonal with respect to the second side of the package body and opposite with respect to the first side of the package body.

The current sensor integrated circuit 100 has secondary leads 110a, 110b, 100c, 110d, 110e, 110f, and 110g. In other embodiments, where fewer than the illustrated seven leads are required or more leads are required for providing more power, ground, output signals, a fault signal, or other input and output pins, there may be fewer or more than seven secondary leads. For example, there may be other numbers of secondary leads, such as two secondary leads, or eight secondary leads, or more than eight secondary leads. Wire bonds 126a 126b, 126c, 126d, 126e, 126f, and 126g connect the die 130 to the secondary, or signal leads, 110a, 110b, 100c, 110d, 110e, 110f, and 110g, respectively.

In an embodiment, the insulator portion 104 extends beyond an edge 109 of the die attach portions 106, 108 toward or adjacent to the secondary leads 110a, 110b, 110c, 110d, 110e, 110f, and 110g in order to provide voltage isolation where the edge of the die attach portions 106, 108 meet the lower package portion, or first mold compound portion 102. In general (although the illustrated insulator portion 104 extends beyond the die attach portion edge 109 in an example embodiment), the insulator portion 104 need only extend beyond the die 130 by at least 200 microns and preferably by 400 microns. In an embodiment, the insulator portion 104 may extend beyond the edge 109 of the die attach portions 106, 108 by at least 50 microns, and in another embodiment the insulator portion 104 extends beyond the edge 109 of the die attach portions 106, 108 by at least 375 microns. An embodiment may have the insulator portion 104 not extend beyond the edge 109 of the die attach portions 106, 108 where the other dimensions between the die attach portions and the secondary leads provide sufficient electrical isolation for the desired application.

In an embodiment, one or more secondary leads 110a, 110b, 110c, 110d, 110e, 110f, and 110g can be connected to die 130 using two or more wire bonds. This may be advantageous when a potential for higher current may exist in the operation of the integrated circuit, such as for a power or ground connection to die 130.

Figure 1B:
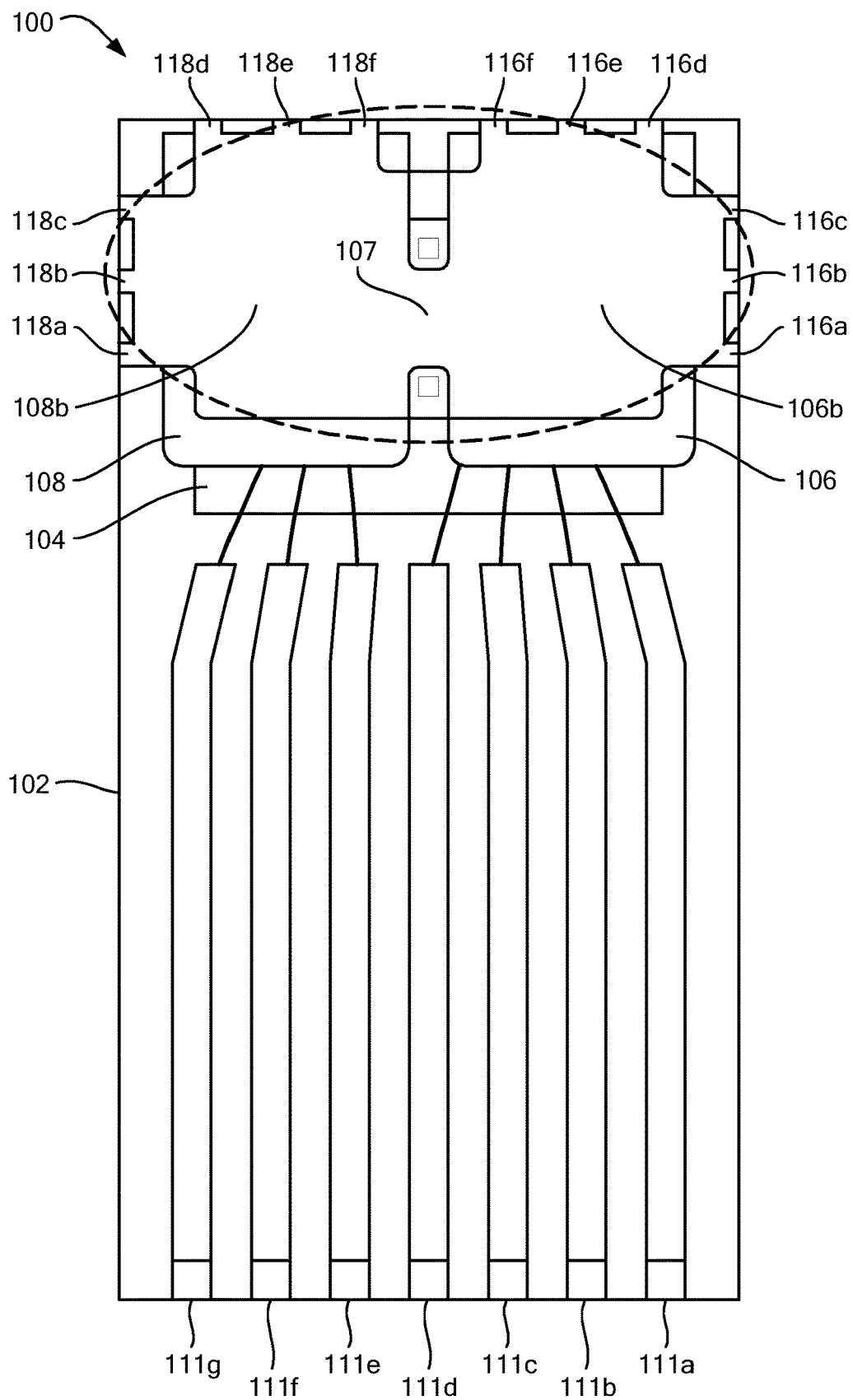
FIG. 1B shows a bottom view of the packaged current sensor integrated circuit of FIG. 1A.

Referring also to FIG. 1B, in which like elements are labeled with like reference numbers, a bottom view of the packaged current sensor integrated circuit 100 is shown. From the bottom view, it can be seen that each of the secondary leads 110a, 110b, 110c, 110d, 110e, 110f, 110g has an exposed portion 111a, 111b, 111c, 111d, 111e, 111f, 111e, 111g, respectively, on the bottom of the package 100. Further, at least a portion of die attach portions 106, 108, current conductor portion 107, and leads 116a, 116b, 116c, 116d, 116e, 116f, 118a, 118b, 118c, 118d, 118e, 118f are also exposed on the bottom of package 100. In use, exposed portions 106b, 108b of the die attach pads 106, 108, respectively, may be connected to a circuit board or other substrate and, due to the larger area of connection possible between the board and at least a portion of the primary current conductor 107, the resistance of the connection may be lower, which results in lower power loss due to the connection resistance of the current sensor package 100 to a circuit board. In another embodiment, a solder connection may also be provided with the current conductor portion 107. If the solder connection or a current path that is not part of the package 100 is provided under the current conductor portion 107 (i.e., an external, non-package conductor), the current sensor IC accuracy may be improved if the gain of the current sensor integrated circuit is programmed with the current path of the current conductor portion 107 in parallel with the non-package conductor, such as a solder and PC board conductor.

The current path portion 107 of the primary conductor 114 can interconnect die attach pads 106, 108 can be narrowed, as shown. Die attach pads 106, 108 may also act as primary current input and output portions, like a primary current lead. The primary conductor 114 has a partial current path that forms line across the package body from the first side of the package with leads 116a-c to the third side of the package with leads 118a-c. If die attach pads 106, 108 are used for primary current input and output leads or portions, then the current may not go through, or may be reduced through the side package leads 116a-f and 118a-f.

The magnetic field sensing elements 132, 134 are positioned off of or to the side of the current conductor portion 107 so that the magnetic field generated by the current flowing in the current conductor portion 107 has a direction component that is perpendicular, or in an embodiment near perpendicular (e.g., in some embodiments within +/−20 degrees of perpendicular and in other embodiments more than +/−20 degrees), to the die 130 such that planar Hall effect elements may be used for magnetic field sensing elements 132, 134. If the magnetic field sensing elements 132, 134 are Hall effect elements, one Hall effect element may be designed to have a positive voltage output when the magnetic field sensed is out of the die 130 (where for clarity "out" is the direction away from the current conductor portion 107), and the second Hall effect element may have a negative voltage when the magnetic field sensed is out of the die 130. Various processing circuitry is responsive to signals from the magnetic field sensing elements for generating an output signal indicative of the current through the current conductor portion 107. Such processing circuitry can include, but is not limited to an amplifier, and in some embodiments a differential amplifier, supported by the integrated circuit die 130 and configured to generate a signal indicative of the difference between the two Hall effect element output voltages. Using the difference between the two magnetic field sensing element output voltages when they are Hall effect elements allows for the integrated circuit to reduce or eliminate the effects of external magnetic fields that are not a result of current through the primary current path, including the current conductor portion 107 (i.e., stray magnetic fields). In other embodiments, the magnetic field sensing elements, or a magnetic field element may be positioned on die 130 over the primary current conductor portion 107 to sense a magnetic field with a component parallel to the surface of die 130. In a case where the magnetic field component to be sensed is parallel to the surface of the die 130, a vertical Hall effect element or a magnetoresistance element such as a GMR, TMR, or AMR element may be used.

Figure 1C:
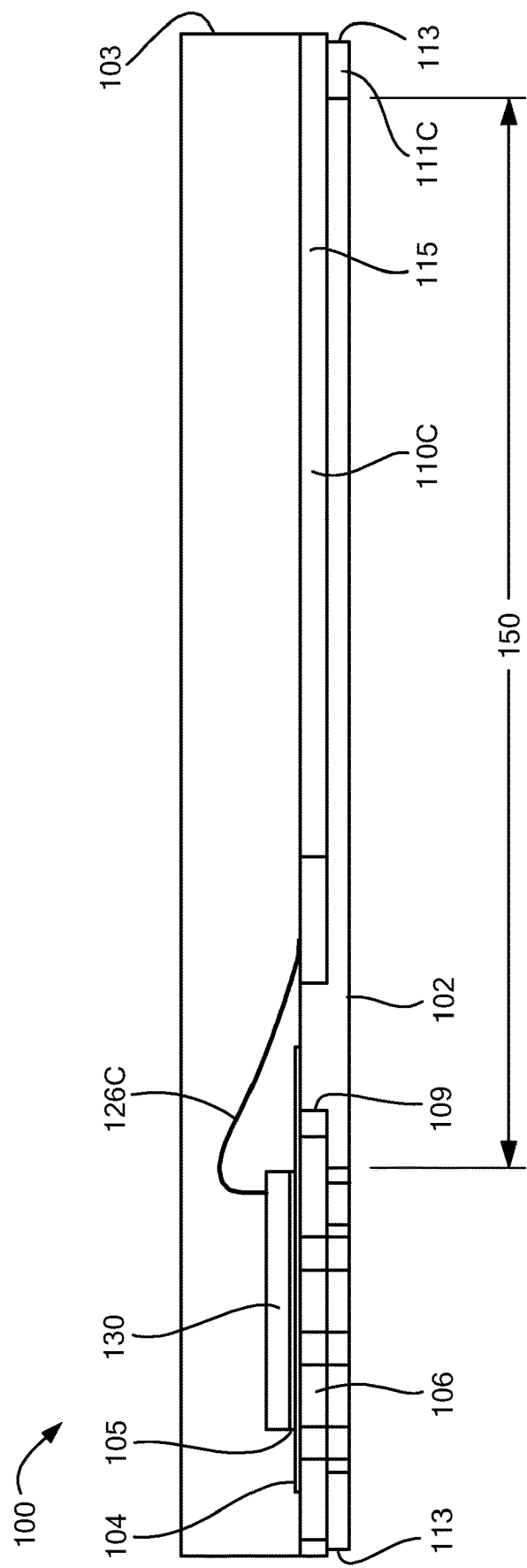
FIG. 1C shows a cross-sectional side view of the packaged current sensor integrated circuit of FIGS. 1A and 1B.

Referring also to FIG. 1C, in which like elements are labeled with like reference numbers, a cross-sectional side view of the packaged current sensor integrated circuit 100 taken along the line C-C of FIG. 1A is shown. The packaged integrated circuit 100 includes the lower package body 102 and an upper package body 103.

The lower package body 102 and secondary leads 110a-110g may have cutouts or recessed portions 113, which in an embodiment may be around all the bottom edges of the packaged current sensor integrated circuit 100. This recessed portion 113 can be used when the packaged current sensor integrated circuit 100 is assembled to a printed circuit board or other assembly to inspect or check for solder connections between the package 100 and the PC Board or assembly.

Die 130 is supported by one or both of the primary conductor die attach portions 106, 108. Die 130 may be attached to the insulator portion 104 by a non-conductive coating (not shown), such as a wafer backside coating (WBC) or a non-conductive epoxy and the insulator portion 104 is attached to die attach portions 106, 108. Alternatively, the die 130 can be attached to the insulator portion 104 by a conductive material as may reduce the effects of partial discharge from voids in the die attach material. Die 130 may be attached to die attach portions 106, 108 by insulator portion 104 where the insulator is a dielectric tape, for example a Kapton® or other insulating tape with a layer of adhesive on one side of the tape or on each side of the dielectric tape layer. In another embodiment, an epoxy die attach material a die-attach film (DAF), or an insulating coating material may be applied as the insulator portion 104 in place of the tape. Aspects of insulator portion 104 can be the same as or similar to insulation structures described in U.S. Pat. No. 10,753,963, issued on Aug. 25, 2020, entitled "Current Sensor Isolation" and hereby incorporated herein by reference in its entirety.

In manufacturing, if two layers of wafer backside coating are used, a first wafer backside coating layer 105 may be fully cured (or partially cured if only one layer of a wafer backside coating is used) before a second layer of wafer backside coating is partially cured (also known as B stage cured) is used to eventually attach die 130 to insulator portion 104.

In another embodiment, the die 130 may be attached to the insulator portion 104 by other materials, including but not limited to a non-conductive die attach epoxy, or a tape. Multiple layers of wafer backside coating, tape, DAF and non-conductive epoxy may be used for electrical isolation. A combination of wafer backside coating, tape, DAF, or non-conductive epoxy may be used to achieve electrical isolation and attachment to the die attach portion 106, 108.

Die 130 can be electrically connected to secondary lead 110c with a wire bond 126c. Secondary leads 110a-110g, as illustrated in FIG. 1C by lead 110c, can be elongated from a first end adjacent to the primary conductor 114 to the exposed portion 111c and can have a thinned portion 115 (e.g., thinner than the thickness of the exposed portion 111c) which provides a locking feature with the first mold portion 102. The thinned portion 115 may be the result of a half etch lead frame process. An example of a half etch process is when the lead frame is etched from two sides and on one etch side is masked or patterned so that a partial thickness (or roughly half) of the lead frame remains at a portion of a lead or the lead frame.

Creepage refers to the shortest distance between primary and secondary conductors along a surface of any insulation material common to both parts, such as the surface of the lower package body 102 outside of the package. In FIG. 1C, the creepage is a distance labeled 150 between the exposed portion 106b of die attach portion 106 and the exposed portion 111c of secondary lead 110c and can be at least 2.0 mm. Thus, achieving a desired creepage distance can be facilitated by providing the secondary leads with thinned portion 115 that is encapsulated by the mold portion 102. In another embodiment, the isolation, or creepage distance 150 is at least 7.2 mm. With the described arrangement of at least 7.2 mm, reinforced isolation according to a standard, such as IEC60664, is achieved for basic working voltages>1000 VRMS. In some embodiments, lower voltage isolation requirements may exist and the isolation distance 150 may be at least 1.0 mm, 2.0 mm, or 4.0 mm to meet certain isolation requirements in different applications.

Clearance refers to the shortest distance between conductors of differing voltage levels, such as between primary and secondary conductors, through an insulating material, such as air outside of the package or through an insulating material inside or outside the package.

Increased clearance distance in the described embodiments can be facilitated by the insulator portion 104 extending beyond edge 109 of the primary conductor 114 since such extended portion increases the clearance distance between the lower voltage level semiconductor die 130 and the higher voltage primary conductor 114.

The insulator portion 104 can provide a second layer of isolation between the primary conductor 114 and wire bonds 126a-g and secondary leads 110a-g, which allows a thinner package than if a 0.4 mm distance were required. It will be appreciated that the isolation distances can be readily varied by stretching or shortening the length of the enclosed portion of the secondary leads in order to achieve a desired isolation voltage.

As noted above, the insulator portion 104 can extend beyond the edge 109 of the primary conductor 114 in the direction of, or from the side of the primary conductor towards, the secondary leads 110a-g. For example, in embodiments, the insulator portion 104 may extend beyond the edge 109 of the primary conductor 114 in the direction of the secondary leads 110a-g by at least 0.1 mm, 0.2 mm, or 0.4 mm depending on the voltage isolation requirements.

Figure 2A:
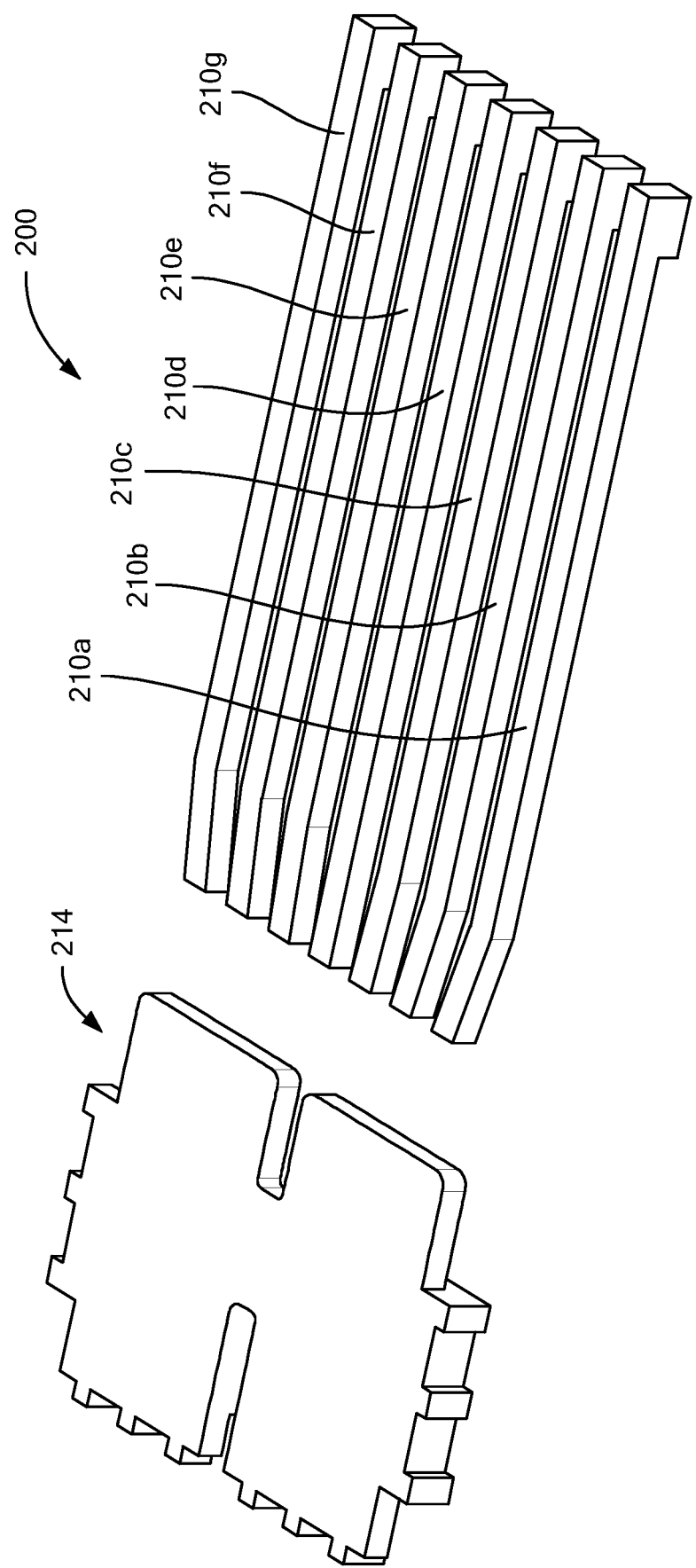
FIG. 2A shows a lead frame portion of a packaged current sensor integrated circuit according to the disclosure.

Referring to FIGS. 2A-2F, steps in the manufacture of the packaged current sensor integrated circuit 100 are shown. FIG. 2A provides a perspective view of the lead frame 200. Lead frame 200 can include frame includes a primary conductor portion 214 that can be the same as or similar to primary conductor portion 114 of FIGS. 1A-1C and secondary leads 210a-210g that can be the same as or similar to the secondary leads 110a-110g of FIGS. 1A-1C. Thus, primary conductor portion 214 can include die attach pads 206, 208 and a narrowed current conductor portion 207, as shown.

In embodiments, lead frame 200 can be stamped from a copper sheet and can be relatively thick (e.g., at least 15 mils thick) in order to support high current (e.g., 200 amps) applications. Alternatively, lead frame 200 can include interconnected metal layers as may be part of a so-called molded interconnect substrate (MIS) that includes a pre-molded structure with one or more layers, with each layer is configured with plating or interconnects to provide electrical connections in the package. In this scenario, stage 330 in the process described below in connection with FIG. 3 can be omitted.

Figure 2B:
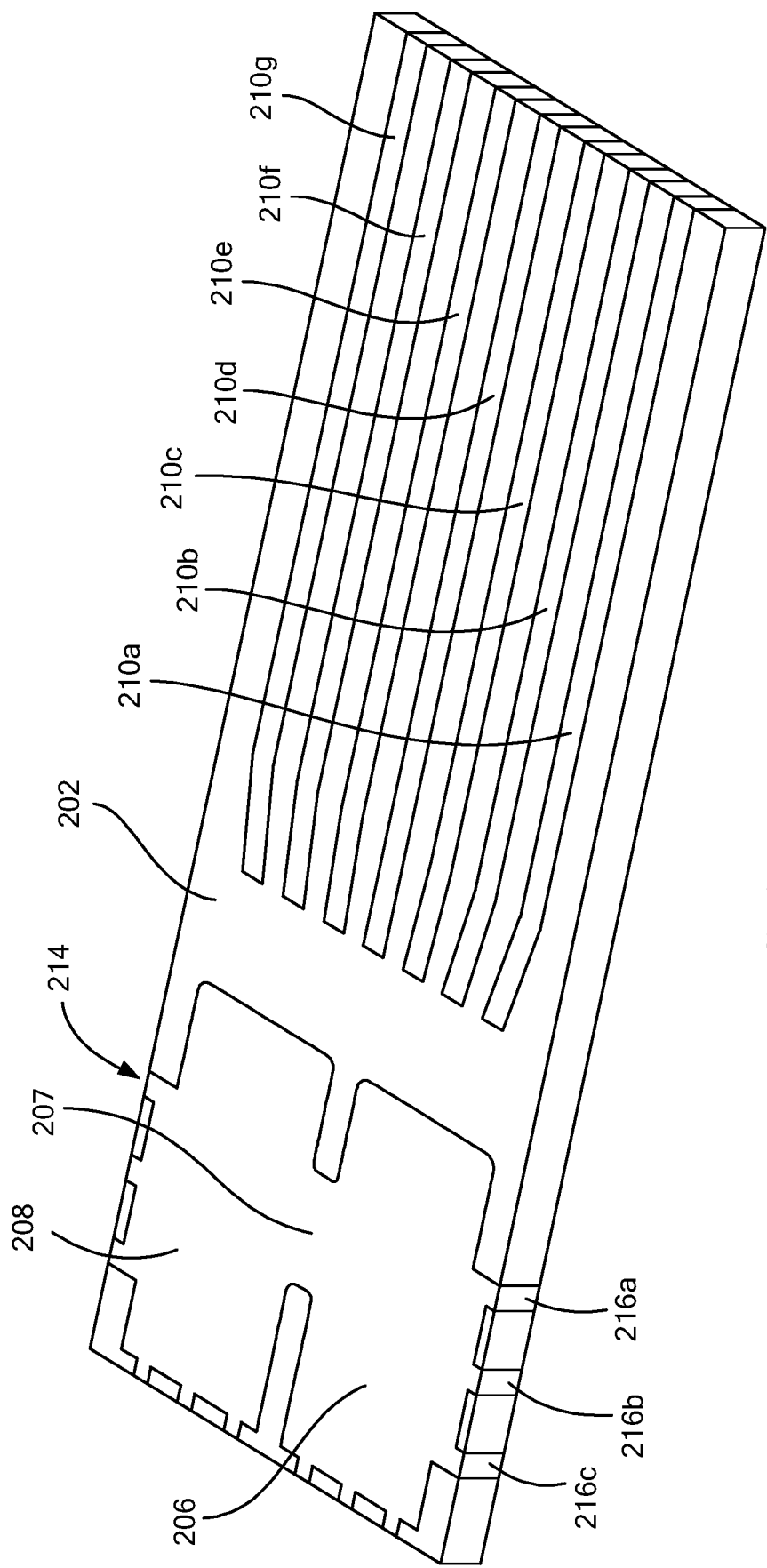
FIG. 2B shows the lead frame portion after a first mold step of a packaged current sensor integrated circuit according to the disclosure.

Referring also to FIG. 2B, a first mold material 202 is applied to the lead frame 200 to provide the illustrated pre-molded lead frame subassembly. From the top perspective view of FIG. 2B, input leads 216a, 216b, 216c can be seen exposed from a side edge of the first mold 202 (which input leads 216a, 216b, 216c can be the same as or similar to input leads 116a, 116b, 116c of FIG. 1A). Although not visible in FIG. 2B, input leads on other sides of the lead frame (e.g., like leads 116d, 116e, 111f, 118a, 118b, 118c, 118d, 118e, and 118f of FIG. 1A) are exposed. Bottom portions of the primary current conductor and the second leads (that may be the same as or similar to portions 106b, 108b and secondary lead portions 111a-111g of FIG. 1B) and a top surface of the lead frame are likewise exposed. The remainder of the lead frame is encased or encapsulated by the mold 102. The resulting illustrated pre-molded lead frame subassembly provides a rigid structure that facilitates the remaining assembly of the packaged current sensor integrated circuit.

Figure 2C:
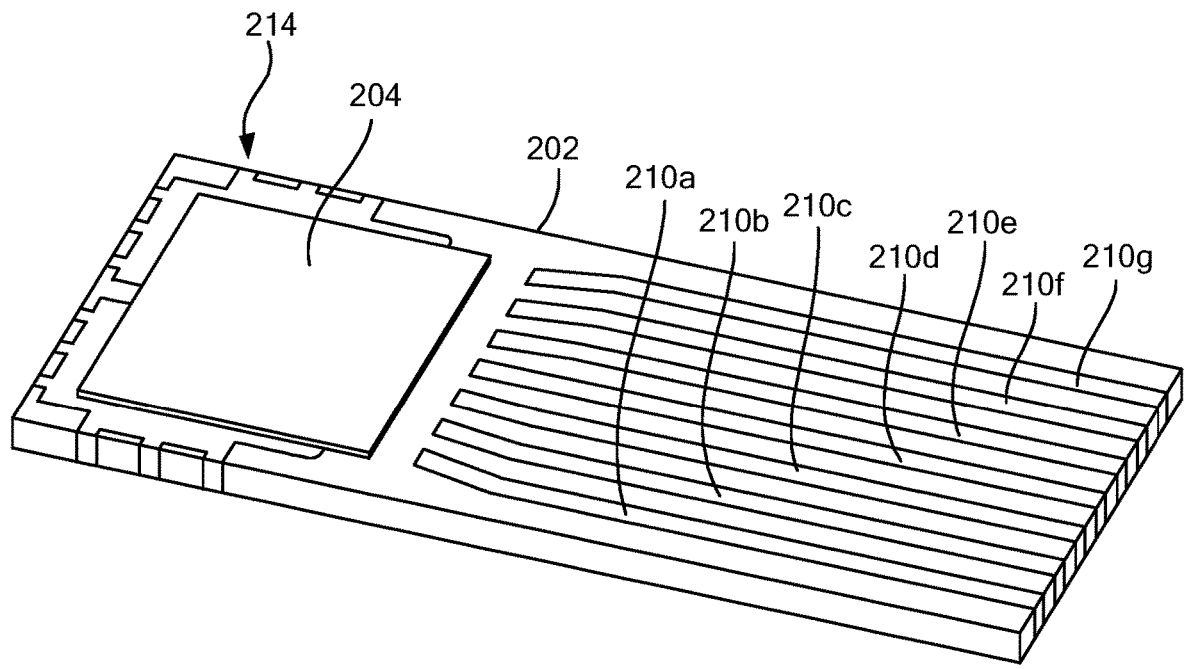
FIG. 2C shows an insulator positioned on the lead frame portion of the packaged current sensor integrated circuit according to the disclosure.

Referring also to FIG. 2C, an insulator portion 204 (that can be the same as or similar to insulator portion 104 of FIGS. 1A-1C) is applied to pre-molded lead frame subassembly of FIG. 2B. In an example embodiment, insulator portion 204 can be a tape.

Figure 2D:
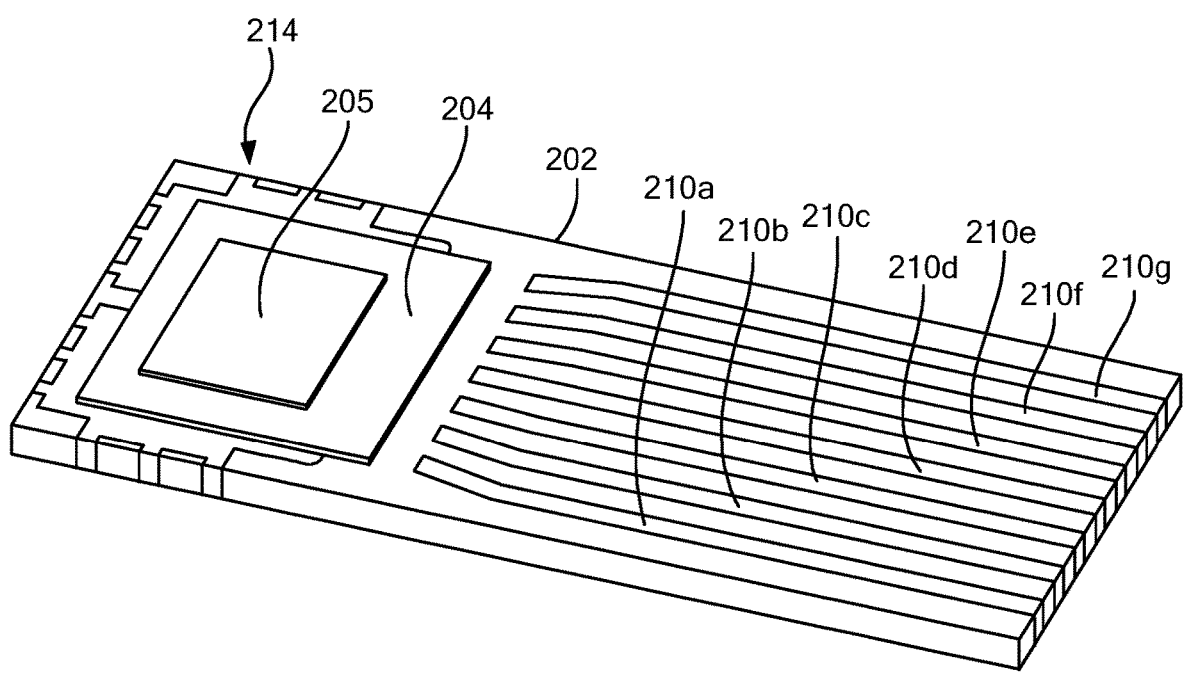
FIG. 2D shows a die attach material dispensed or printed on the insulator on the lead frame of a packaged current sensor integrated circuit according to the disclosure.

FIG. 2D shows that a second insulator portion 205 can be applied to the insulator portion 204. In an embodiment, the second insulator portion 205 can be a wafer backside coating which is applied to the die and then during die attach the wafer backside coating becomes attached to insulator portion 204. In another embodiment, the second insulating portion 205 may be a die attach material, including but not limited to an epoxy die attach material.

Figure 2E:
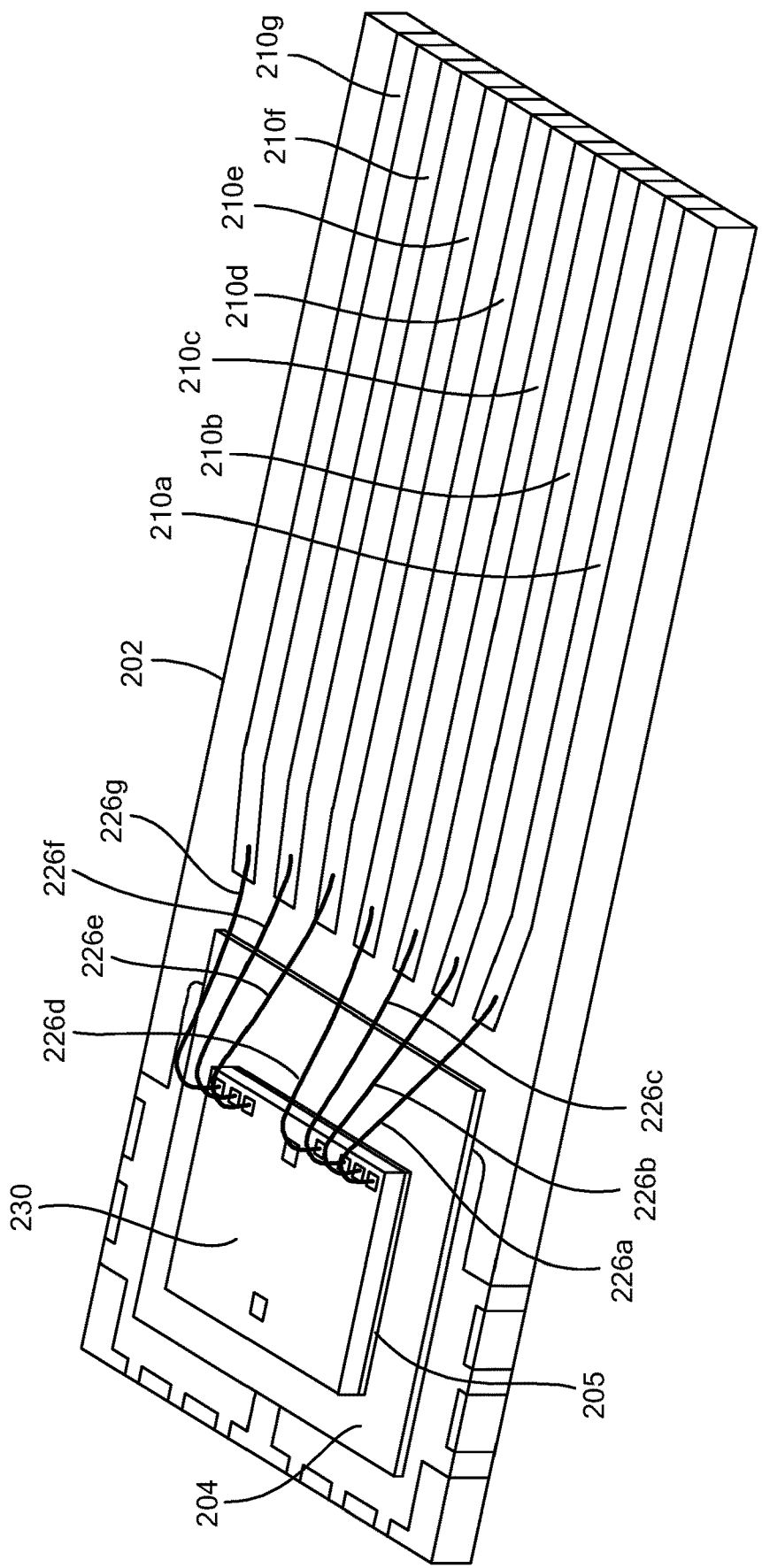
FIG. 2E shows an integrated circuit die positioned on the die attach material and shows wire bonds connecting the integrated circuit die to secondary leads of a packaged current sensor integrated circuit according to the disclosure.

Referring also to FIG. 2E, an integrated circuit die 230 that can be the same as or similar to die 130 of FIGS. 1A-1C is attached to the insulator portions 204, 205. Wire bonds 226a, 226b, 226c, 226d, 226e, 226f, 226g can be used to electrically connect the integrated circuit 230 to signal leads 210a, 210b, 210c, 210d, 210e, 210f, 210g, respectively, as shown.

Figure 2F:
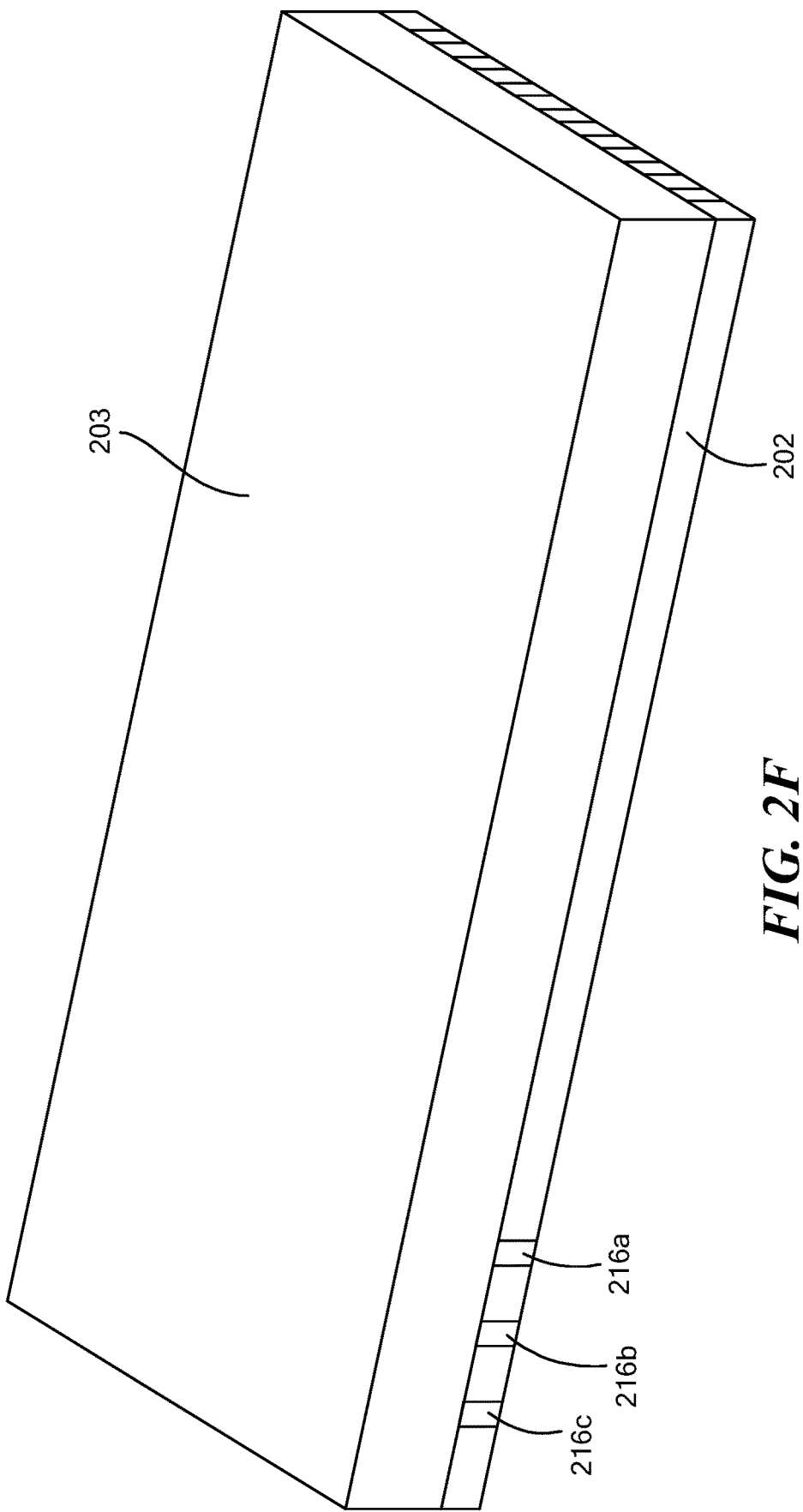
FIG. 2F shows the molded body of a packaged current sensor integrated circuit according to the disclosure.

FIG. 2F shows a second mold material 203 over the die, wire bonds, and the first mold material 202. Notably, the primary conductor 114 does not extend beyond the second mold 203. In other words, while input leads 216a, 216b, 216c are exposed on a side edge of the first mold 202, neither the input nor output portions of the primary conductor 114 extend beyond the mold.

Figure 3:
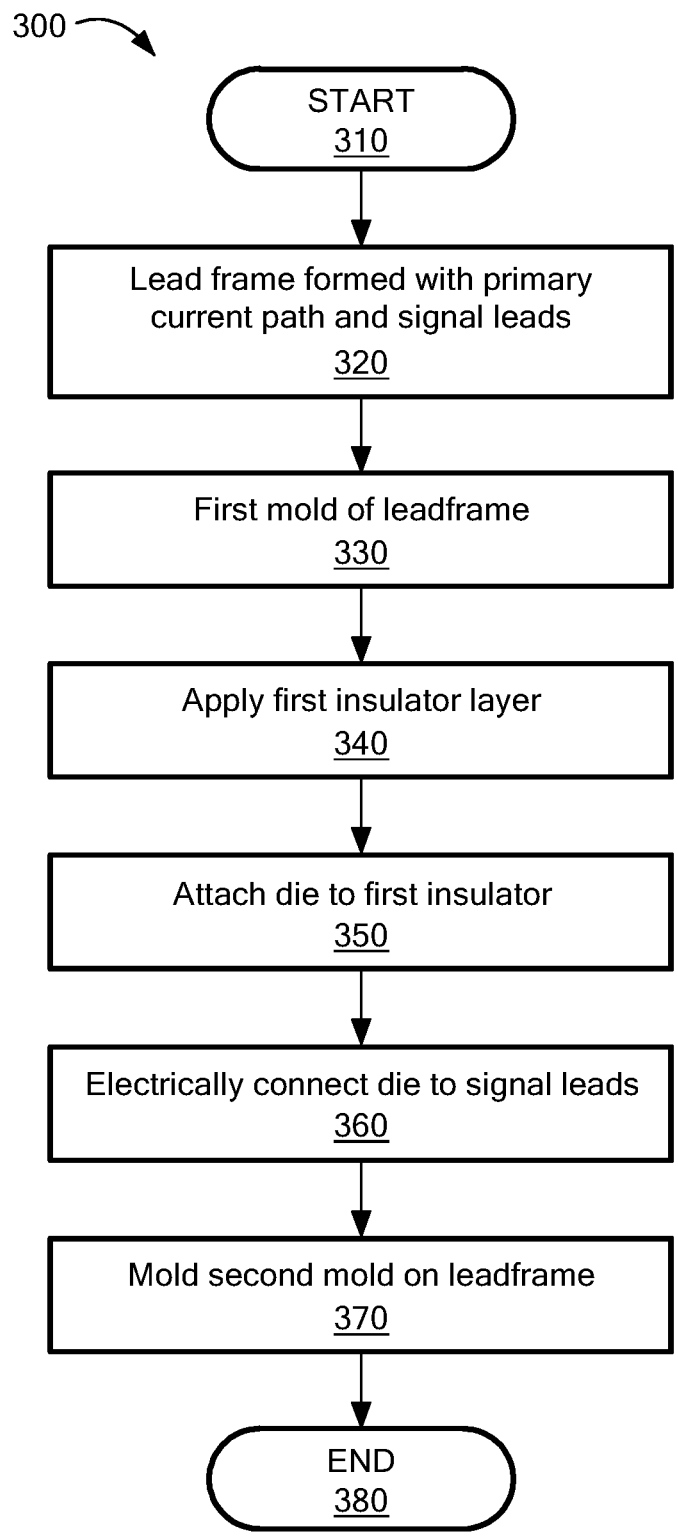
FIG. 3 shows a process flow of the integrated circuit package fabrication according to the disclosure.

FIG. 3 shows an overview of a manufacturing process 300 for the packaged current sensor integrated circuits described herein. The process starts at stage 310. A lead frame (e.g., lead frame 200 of FIG. 2A) is formed with primary current conductor and secondary signal leads in stage 320.

In stage 330, the first mold (e.g., first mold 102 or 202) is performed with an insulating mold material including but not limited to an epoxy mold compound. The result of stage 330 is the pre-molded lead frame subassembly shown in FIG. 2B with a top surface of the lead frame flush or substantially flush with a top surface of the first mold.

At stage 340, an insulation layer, that may be the same as or similar to insulator portions 104, 204, 205, is applied. The insulation may comprise one or more of a dielectric tape, an insulating epoxy material, or a piece of insulating material including but not limited to alumina or glass substrate material.

At stage 350, an integrated circuit die, as may be the same as or similar to die 130, 230, is attached to the subassembly. Attachment of the die can include, but is not limited to, use of a wafer backside coating material, a tape attachment material, and/or an insulating epoxy material, which may also be referred to as a non-conductive epoxy material. In an embodiment, the first insulator layer step 340 and the die attach step 350 may both utilize wafer backside coating layers, where the first wafer backside coating material is applied to the integrated circuit die, or die, and this first layer is fully cured and then the second wafer backside material is partially cured before attachment to the molded lead frame subassembly.

The integrated circuit die is electrically connected to the signal leads in stage 360. Other electrical connections, including flip-chip assembly methods, may be be used provided they meet the isolation requirements of the package.

At stage 370, a second mold material (as may be the same as or similar to mold material 103, 203), or other final package material, is applied to the subassembly including the lead frame, integrated circuit die, and wire bonds.

Advantageously, in the case of the illustrated molded leadless package (MLP) embodiments of this disclosure, many integrated circuit packages can be molded at the same time in a single mold cavity, or in a number of cavities less than one per final package, in order to increase the number of molded packages per mold shot. This fabrication technique is in contrast to processes in which every integrated circuit is individually molded, thereby resulting in higher cost and reduced density of units per mold shot.

After the mold process of stage 370, the packages are cut, or singulated, with a process such as a saw, or laser cutter, to form a single integrated circuit package. Because multiple units are molded in a single cavity, singulation results in the above-described configuration in which the primary conductor does not extend beyond the molds. At stage 380, the integrated circuit package is complete.

Other steps may follow manufacturing, which include, but are not limited to a final test procedure, or programming the integrated circuit package. In the case of a current sensor integrated circuit package there may be a test step and may be programming of the integrated circuit die at the integrated circuit package level, and then a second test and programming may be performed, for example, when the current sensor integrated circuit package is applied to a printed circuit board or other assembly where the current sensor integrated circuit package is used. This second programming after assembly of the current sensor integrated circuit package onto a PC board or other assembly, allows a more accurate measurement of the current to be made as other influences such as PC board currents can be accounted for in the current sensor integrated circuit.

It is understood that any of the above-described processing may be implemented in hardware, firmware, software, or a combination thereof. Processing may be implemented in computer programs executed on programmable computers/machines that each includes a processor, a storage medium or other article of manufacture that is readable by the processor (including volatile and non-volatile memory and/or storage elements), at least one input device, and one or more output devices. Program code may be applied to data entered using an input device to perform processing and to generate output information.

Having described exemplary embodiments of the disclosure, it will now become apparent to one of ordinary skill in the art that other embodiments incorporating their concepts may also be used. The embodiments contained herein should not be limited to disclosed embodiments but rather should be limited only by the spirit and scope of the appended claims. All publications and references cited herein are expressly incorporated herein by reference in their entirety.

Elements of different embodiments described herein may be combined to form other embodiments not specifically set forth above. Various elements, which are described in the context of a single embodiment, may also be provided separately or in any suitable subcombination. Other embodiments not specifically described herein are also within the scope of the following claims.

What is claimed is:

1. A method of manufacturing a current sensor integrated circuit package comprising:
providing a lead frame comprising a primary conductor and at least two secondary leads, wherein the primary conductor comprises an input portion and an output portion, a first die attach portion, a second die attach portion, and a current conductor portion, wherein the primary conductor is configured to carry a current from the input portion through the first die attach portion, the current conductor portion, the second die attach portion, and the output portion, and wherein each of the at least two secondary leads has an exposed portion spaced from the exposed portion of the primary conductor by an isolation distance of at least 2.0 mm;

providing a first mold of an insulating material to partially enclose part of the output portion, the first and second die attach portions, and the at least two secondary leads;

providing an insulator portion on the first die attach portion, second die attach portion, current conductor portion, and the first mold;

providing a semiconductor die on the insulator portion;

providing wire bonds to connect the semiconductor die to the at least two secondary leads;

providing at least one magnetic field sensing element supported by the semiconductor die and positioned near the current conductor portion; and providing a second mold of an insulating material to enclose the semiconductor die, wire bonds, and insulator portion, wherein the second mold forms a package body, wherein the input portion of the primary conductor is exposed from a first side of the package body and a second side of the package body that is substantially orthogonal with respect to the first side of the package body, and when the output portion of the primary conductor is exposed from the second side of the package body and a third side of the package body that is substantially orthogonal with respect to the second side of the package body and opposite with respect to the first side of the package body.

2. The method of claim 1 wherein the input portion and the output portion of the primary conductor do not extend beyond the second mold.

3. The method of claim 1 wherein the at least one magnetic field sensing element comprises a first magnetic field sensing element disposed adjacent to a first side of the current conductor portion and wherein the method further comprises providing a second magnetic field sensing element disposed adjacent to a second side of the current conductor portion opposite to the first side.

4. The method of claim 1 wherein the at least one magnetic field sensing element is one of a planar Hall effect element, a vertical Hall effect element, a anisotropic magnetoresistance (AMR) element, a giant magnetoresistance (GMR) element, a tunneling magnetoresistance (TMR) element, or coil.

5. The method of claim 1 wherein a distance between an exposed portion of the primary conductor and an exposed portion of the secondary leads is at least 1.0 mm.

6. The method of claim 1 wherein a distance between an exposed portion of the primary conductor and an exposed portion of the secondary leads is at least 7.2 mm.

7. The method of claim 1 wherein providing the first and second molds are performed in a single cavity for the lead frame.

8. The method of claim 7 further comprising singulating the molded lead frame into individual current sensor packages.

9. A current sensor integrated circuit package comprising:

a primary conductor having an input portion and an output portion, wherein the primary conductor is configured to carry a current from the input portion of the primary conductor to the output portion of the primary conductor, wherein the primary conductor further comprises an exposed portion;

at least two secondary leads, each having an exposed portion spaced from the exposed portion of the primary conductor by an isolation distance of at least 2.0 mm;

a semiconductor die disposed adjacent to the primary conductor and positioned on an insulator portion;

at least one magnetic field sensing element supported by the semiconductor die; and a package body enclosing the semiconductor die and at least a portion of the primary conductor, wherein the input portion of the primary conductor is exposed from a first side of the package body and a second side of the package body that is substantially orthogonal with respect to the first side of the package body, and wherein the output portion of the primary conductor is exposed from the second side of the package body and a third side of the package body that is substantially orthogonal with respect to the second side of the package body and opposite with respect to the first side of the package body.

10. The current sensor integrated circuit package of claim 9 wherein the primary conductor and the at least two secondary leads are partially encased by a first mold portion.

11. The current sensor integrated circuit package of claim 9 wherein an isolation distance between an exposed portion of the at least two secondary leads and an exposed portion of the primary conductor is at least 4.0 mm.

12. The current sensor integrated circuit package of claim 9 wherein an isolation distance between an exposed portion of the at least two secondary leads and an exposed portion of the primary conductor is at least 7.2 mm.

13. The current sensor integrated circuit package of claim 9 wherein at least one secondary lead provides an output connection, at least one secondary lead provides a voltage input connection, and at least one secondary lead provides a ground connection.

14. The current sensor integrated circuit package of claim 9 further comprising a front-end amplifier, wherein the at least one magnetic field sensing element is coupled to the front-end amplifier.

15. The current sensor integrated circuit package of claim 9 comprising at least two magnetic field sensing elements.

16. The current sensor integrated circuit package of claim 15 wherein the at least two magnetic field sensing elements are Hall effect elements.

17. The current sensor integrated circuit package of claim 16 wherein the at least two magnetic field sensing elements are coupled to provide a differential output.

18. The current sensor integrated circuit package of claim 9 wherein at least one of the secondary leads provides a fault signal.

19. The current sensor integrated circuit package of claim 9 further comprising a wafer backside coating material on a back side of the semiconductor die.

20. The current sensor integrated circuit package of claim 19 further comprising a second wafer backside coating material on the back of the semiconductor die.

21. The current sensor integrated circuit package of claim 9 wherein the exposed portion of the primary conductor is substantially orthogonal to the first side of the package body, the second side of the package body, and the third side of the package body.

22. The current sensor integrated circuit of claim 9 wherein the insulator portion extends beyond an edge of the primary conductor towards the at least two secondary leads.

23. The current sensor integrated circuit of claim 22 wherein the insulator portion extends beyond the edge of the primary conductor towards the at least two secondary leads by at least 0.1 mm.

24. The current sensor integrated circuit of claim 22 wherein the insulator portion extends beyond the edge of the primary conductor towards the secondary leads by at least 0.4 mm.

* * * * *